(12) United States Patent
Wang et al.

(10) Patent No.: US 10,192,780 B1
(45) Date of Patent: Jan. 29, 2019

(54) SELF-ALIGNED MULTIPLE PATTERNING PROCESSES USING BI-LAYER MANDRELS AND CUTS FORMED WITH BLOCK MASKS

(71) Applicant: GLOBALFOUNDRIES Inc., Grand Cayman (KY)

(72) Inventors: Xiaohan Wang, Clifton Park, NY (US); Jiehui Shu, Clifton Park, NY (US); Brendan O'Brien, Ballston Spa, NY (US); Terry A. Spooner, Halfmoon, NY (US); Jinping Liu, Ballston Lake, NY (US); Ravi Prakash Srivastava, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/991,529

(22) Filed: May 29, 2018

(51) Int. Cl.
| | |
|---|---|
| *H01L 29/40* | (2006.01) |
| *H01L 21/768* | (2006.01) |
| *H01L 21/311* | (2006.01) |
| *H01L 23/522* | (2006.01) |
| *H01L 23/528* | (2006.01) |

(52) U.S. Cl.
CPC .. *H01L 21/76816* (2013.01); *H01L 21/31144* (2013.01); *H01L 23/5226* (2013.01); *H01L 23/5283* (2013.01)

(58) Field of Classification Search
CPC ......... H01L 21/76816; H01L 21/31144; H01L 23/5283; H01L 23/5226
See application file for complete search history.

(56) References Cited

U.S. PATENT DOCUMENTS

| | | |
|---|---|---|
| 9,443,716 B2 | 9/2016 | Takeshita et al. |
| 9,548,243 B1 | 1/2017 | Briggs et al. |
| 9,711,447 B1 | 7/2017 | Shu et al. |
| 9,793,163 B2 | 10/2017 | Bristol et al. |
| 9,852,986 B1 | 12/2017 | Stephens et al. |

OTHER PUBLICATIONS

M. van Veenhuizen et al., "Demonstration of an electrically functional 34 nm metal pitch interconnect in ultralow-k ILD using spacer-based pitch quartering", 2012 IEEE International Interconnect Technology Conference, San Jose, CA, 2012, pp. 1-3.

*Primary Examiner* — Elias M Ullah
(74) *Attorney, Agent, or Firm* — Thompson Hine LLP; Anthony Canale

(57) ABSTRACT

Methods of self-aligned double patterning and improved interconnect structures formed by self-aligned double patterning. A mandrel line including an upper layer and a lower layer is formed over a hardmask. A non-mandrel cut block is formed over a portion of a non-mandrel line, after which the upper layer of the mandrel line is removed. An etch mask is formed over a first section of the lower layer of the mandrel line defining a mandrel cut block over a first portion of the hardmask. The first section of the lower layer is arranged between adjacent second sections of the lower layer. The second sections of the lower layer of the mandrel line are removed to expose respective second portions of the hardmask, and the second portions of the hardmask are removed to form a trench. The mandrel cut block masks the first portion of the hardmask during the etching process.

20 Claims, 12 Drawing Sheets

SELF-ALIGNED MULTIPLE PATTERNING PROCESSES USING BI-LAYER MANDRELS AND CUTS FORMED WITH BLOCK MASKS

BACKGROUND

The present invention relates to semiconductor device fabrication and integrated circuits and, more specifically, to methods of self-aligned double patterning and interconnect structures formed by self-aligned double patterning.

A back-end-of-line (BEOL) interconnect structure may be used to connect device structures, which have been fabricated on a substrate during front-end-of-line (FEOL) processing, with each other and with the environment external to the chip. Self-aligned patterning processes used to form a BEOL interconnect structure involve linear mandrels acting as sacrificial features that establish a feature pitch. Non-mandrel lines are arranged as linear spaces between sidewall spacers that are formed adjacent to the sidewalls of the mandrels. After the mandrels are pulled to define mandrel lines, the sidewall spacers are used as an etch mask to etch a pattern predicated on the mandrel lines and the non-mandrel lines into an underlying hardmask. The pattern is subsequently transferred from the hardmask to an interlayer dielectric layer to define trenches in which the wires of the BEOL interconnect structure are formed.

Mandrel cuts may be formed in the mandrels in order to section the mandrels and define discontinuities between the sections. Non-mandrel cuts may also be formed along non-mandrel lines and may include portions of the spacer material used to form the sidewall spacers. The mandrel cuts and non-mandrel cuts are included in the pattern that is transferred to the hardmask and subsequently transferred from the hardmask to form the trenches in the interlayer dielectric layer. The mandrel cuts and non-mandrel cuts appear in the BEOL interconnect structure as adjacent wires that are spaced apart at their tips with a tip-to-tip spacing related to the dimension of the discontinuity.

The tip-to-tip spacing for a cut mandrel is limited to a distance equal to twice the thickness of the sidewall spacers. If the tip-to-tip spacing is greater than this distance, the sidewall spacers do not merge within the mandrel cut between the sections of the mandrel, which results in incomplete filling of the mandrel cut. Transverse to the length of the cut mandrel, the mandrel cut is arranged in the pattern between non-mandrel lines that flank the cut mandrel line. The result of the incomplete filling can be a short between wires in the BEOL interconnect structure formed using the non-mandrel lines at the location of the mandrel cut. In addition, the wrapping of the sidewall spacers about the tips of the sections of the cut mandrel may introduce notches or indents at the side edges of the merged sidewall spacers. These notches or indents may form metal asperities that project from the side edges of wires formed using the adjacent non-mandrel lines into the mandrel cut. The proximity of these metal asperities may also result in shorting of wires in the BEOL interconnect structure formed using the non-mandrel lines.

Improved methods of self-aligned double patterning and improved interconnect structures formed by self-aligned double patterning are thus needed.

SUMMARY

In an embodiment of the invention, a method includes forming a mandrel line with an upper layer and a lower layer arranged over a hardmask. A non-mandrel line is formed adjacent to the mandrel line, and a non-mandrel cut block is formed over a portion of the non-mandrel line. The upper layer of the mandrel line is removed. An etch mask is formed over a first section of the lower layer of the mandrel line that is arranged laterally between adjacent second sections of the lower layer and that defines a mandrel cut block over a first portion of the hardmask. The second sections of the lower layer of the mandrel line are removed to expose respective second portions of the hardmask, and the second portions of the hardmask are removed to form a trench. The first portion of the hardmask is masked during the etching process by the mandrel cut block.

In another embodiment of the invention, a structure includes a first metallization line that has a first outer sidewall, a second outer sidewall, a first section, a second section, and a cut disposed between the first section and the second section. The cut spans a first distance between a first end of the first section and a second end of the second section. The structure also includes a second metallization line adjacent to the first metallization line, where the second metallization line has a third outer sidewall adjacent to and parallel to the first outer sidewall of the first metallization line. The first outer sidewall and the third outer sidewall are separated by a second distance, and the first distance is greater than two times the second distance.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIGS. 2A-11A and FIGS. 2B-11B are cross-sectional views, of the structure at successive fabrication stages of the processing method subsequent to FIGS. 1, 1A, 1B.

DETAILED DESCRIPTION

Figure 1:
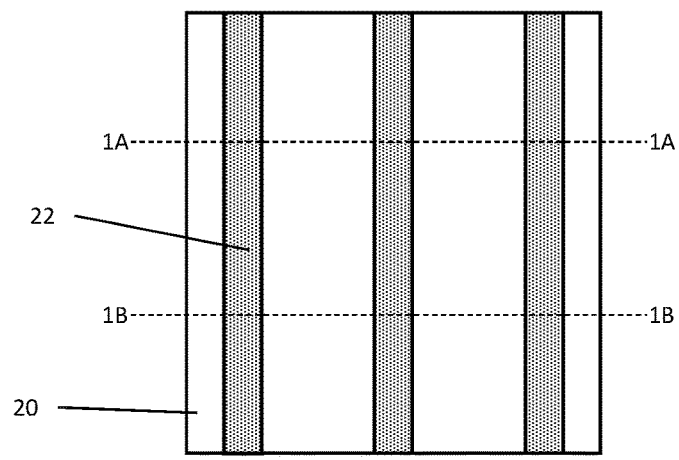
FIG. 1 is a top view of a structure at an initial stage of a processing method in accordance with embodiments of the invention.
Figure 1A:
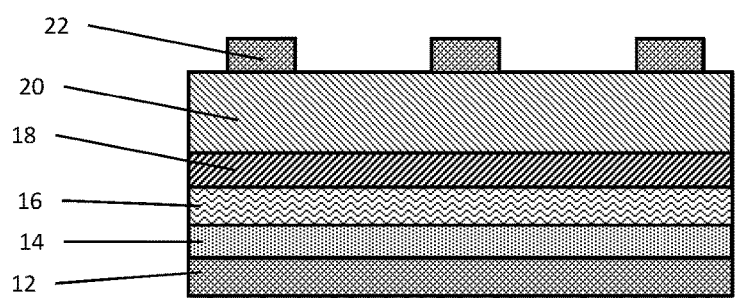
FIG. 1A is a cross-sectional view taken generally along line 1A-1A in FIG. 1.
Figure 1B:
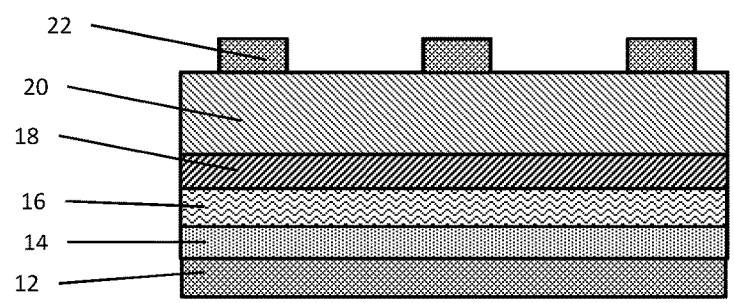
FIG. 1B is a cross-sectional view taken generally along line 1B-1B in FIG. 1.

With reference to FIGS. 1, 1A, 1B and in accordance with embodiments of the invention, an interlayer dielectric layer 14 is disposed over a substrate 12, and a lower hardmask 16 is disposed over the interlayer dielectric layer 14. A layer stack including an upper hardmask 18 and a mandrel layer 20 is formed over the lower hardmask 16, and a mandrel patterning layer 22 is formed over the mandrel layer 20. The substrate 12 may include device structures (not shown) fabricated by front-end-of-line (FEOL) processing to form an integrated circuit.

The interlayer dielectric layer 14 may be composed of an electrically-insulating dielectric material, such as hydrogen-enriched silicon oxycarbide (SiCOH) or another type of low-k dielectric material, deposited by chemical vapor deposition (CVD). The lower hardmask 16 may be composed of a metal-based material, such as titanium nitride, suitable for use as a hardmask. The upper hardmask 18 may be composed of a dielectric material, such as silicon nitride, suitable for use as a hardmask. The mandrel layer 20 may, in one example, be composed of amorphous silicon (α-Si). The mandrel patterning layer 22 may be composed of a dielectric material, such as a low-temperature oxide (LTO) of silicon. The mandrel patterning layer 22 is patterned and etched, as shown in FIGS. 1, 1A, and 1B, to correspond to mandrel lines that are to be patterned as described below. The mandrel patterning layer 22 may be patterned and etched, for example, via a lithography and etching process.

Figure 2:
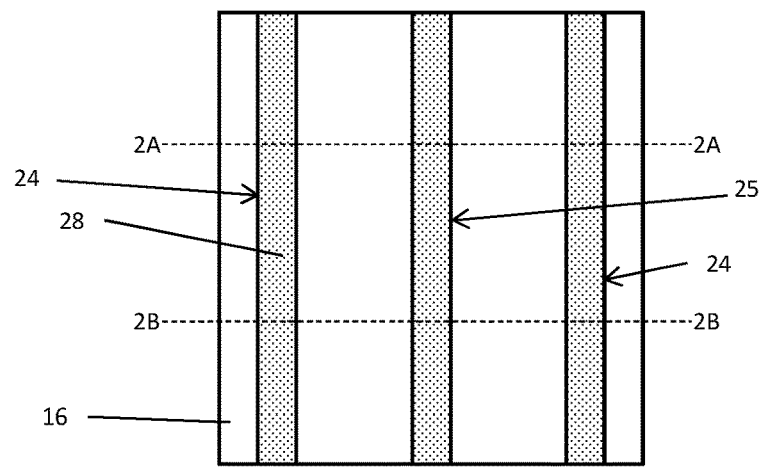
FIGS. 2-11 are top views.
Figure 2A:
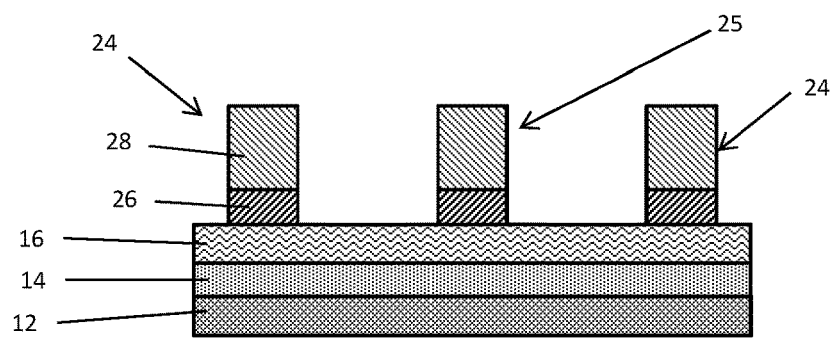
Figure 2B:
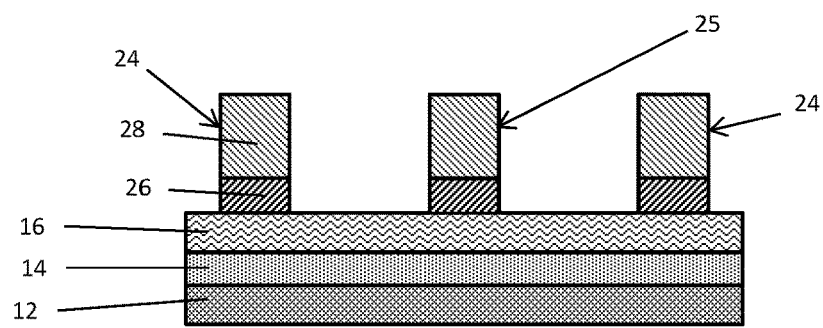

With reference to FIGS. 2, 2A, 2B in which like reference numerals refer to like features in FIGS. 1, 1A, 1B and at a subsequent fabrication stage of the processing method, the mandrel layer 20 and upper hardmask 18 are both etched to transfer the pattern of the mandrel patterning layer 22 and form mandrel lines 24, 25. The mandrel lines 24, 25 are bi-layer mandrel lines that each include a lower mandrel line layer 26 formed from the upper hardmask 18 and an upper mandrel line layer 28 formed from mandrel layer 20. The mandrel layer 20 may be etched in one etching process, such as a selective reactive ion etch (RIE) process, that removes the material of the mandrel layer 20 selective to the materials of the upper hardmask 18 and mandrel patterning layer 22, and the upper hardmask 18 may be etched in a separate etching process that removes the material of the upper hardmask 18 selective to the materials of the mandrel layer 20 and lower hardmask 16. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. The mandrel patterning layer 22 may be removed following etching of the mandrel layer 20.

In conventional self-aligned double-patterning processes, cuts to be formed in mandrel lines are defined by cutting the patterned mandrel patterning layer 22 before etching the mandrel layer 20. However, forming cuts in the mandrel lines in this manner may be undesirable for several reasons. For example, conventional mandrel line cuts are generally limited in width or end-to-end spacing by the width of spacers formed on sidewalls of the cut mandrel lines, and generally are limited to an end-to-end spacing between the cut mandrel lines that is less than or equal to twice the spacer thickness, which may limit flexibility in the design of metallization lines. As well, the spacers follow the contour of the mandrel lines and merge within the cuts, which produces gaps or indentations between the converging spacers at the edges of the cuts, leading to a "necking" distortion effect in the non-mandrel lines at these gaps. At later fabrication stages when the non-mandrel lines are etched into masking layers, the non-mandrel lines are distorted and wider than designed at these gaps, leading to distorted metallization lines that may be insufficiently separated from adjacent metallization lines and potentially leading to shorts in the circuit structure. In the processes described herein, cuts in the bi-layer mandrel lines 24, 25 are not defined until after the non-mandrel lines have been patterned and cut, as described further below. Subsequently, the cut mandrel lines and cut non-mandrel lines are patterned together into the lower hardmask 16 in a single etch step. This avoids distortions being formed in the non-mandrel lines and also allows for greater design flexibility as the mandrel line cuts are not limited by spacer thickness.

Figure 3:
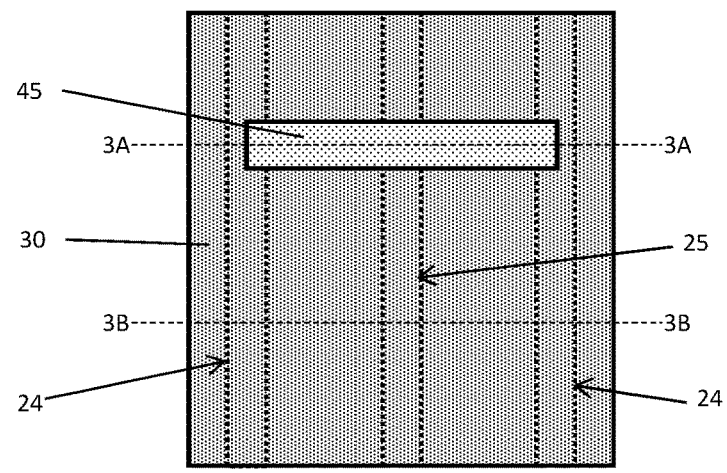
Figure 3A:
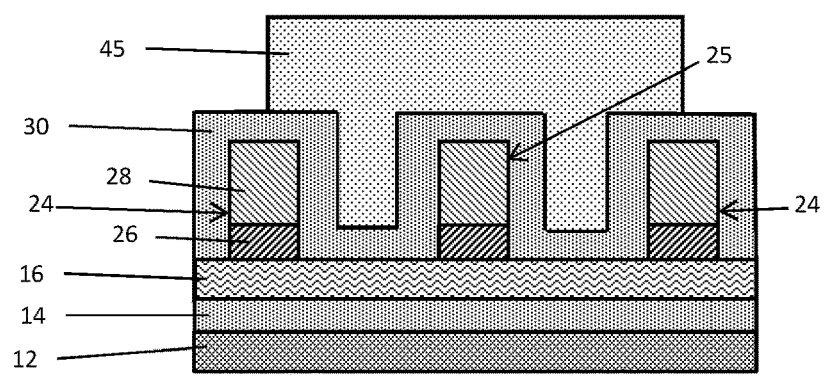
Figure 3B:
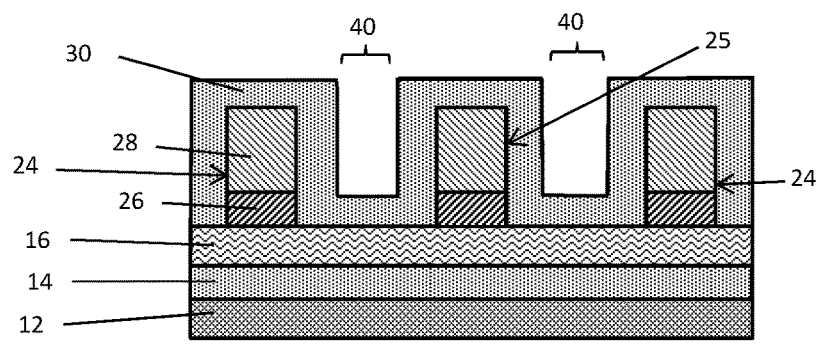

With reference to FIGS. 3, 3A, 3B in which like reference numerals refer to like features in FIGS. 2, 2A, 2B and at a subsequent fabrication stage of the processing method, a spacer layer 30 is deposited over the mandrel lines 24, 25 and lower hardmask 16. The spacer layer 30 may be a conformal layer deposited by any deposition technique, such as chemical vapor deposition (CVD) or atomic layer deposition (ALD), and may be composed of a dielectric material, such as an oxide of silicon or an oxide of titanium. Gaps between the spacer layer 30 on sidewalls of adjacent mandrel lines 24, 25 define non-mandrel lines 40 disposed between adjacent pairs of mandrel lines 24, 25. The spacer layer 30 may have a defined thickness as deposited over the mandrel lines 24, 25 and the lower hardmask 16.

After spacer layer 30 is formed, a non-mandrel etch mask 45 is formed over one or more of the non-mandrel lines 40. The non-mandrel etch mask 45 may also extend over portions of mandrel lines 24, 25 as well as non-mandrel lines 40. The non-mandrel etch mask 45 may be formed, for example, by depositing a etch mask material over spacer layer 30, then forming a patterned lithography stack (not shown) over the etch mask material that exposes portions of the etch mask material to be removed and covers other portions of the etch mask material corresponding to the non-mandrel etch mask 45. The etch mask material may be composed of a material resistant to subsequent etching processes described below, such as a polymer, an organic planarization material, or another dielectric material. The exposed portions of the etch mask material are removed by a selective etching process that is selective to the material of the spacer layer 30, leaving the non-mandrel etch mask 45 over the spacer layer 30.

Figure 4:
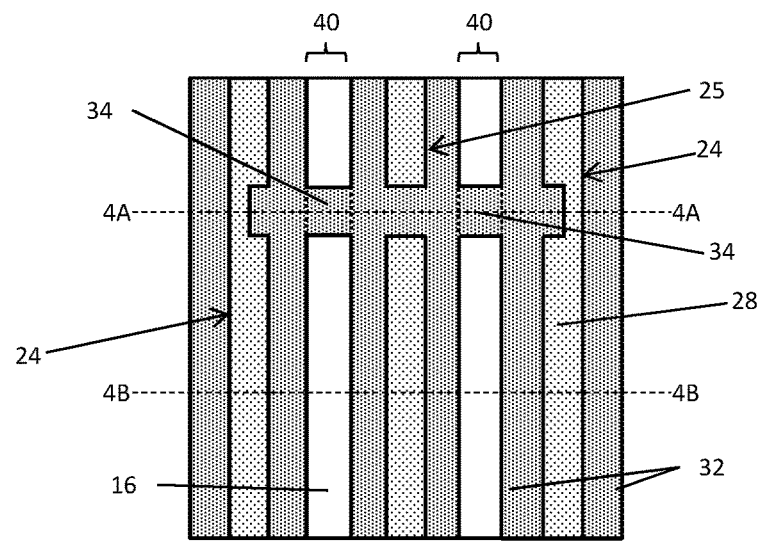
Figure 4A:
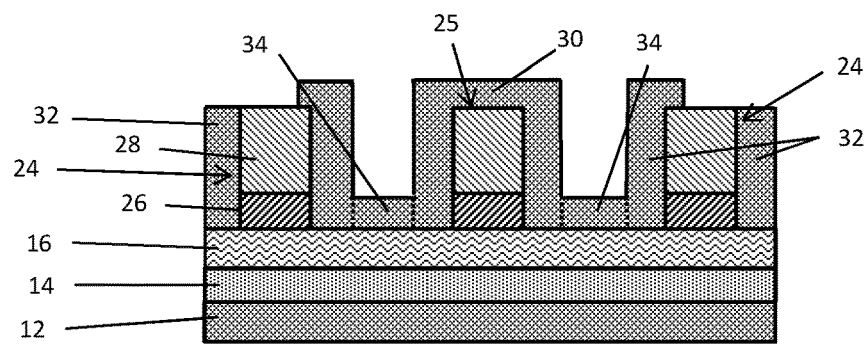
Figure 4B:
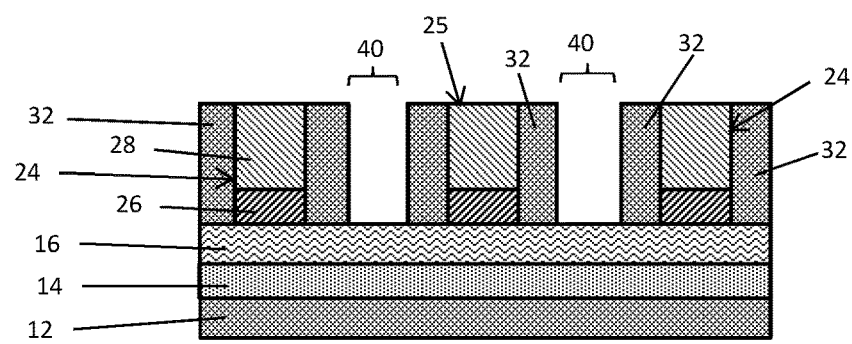

With reference to FIGS. 4, 4A, 4B in which like reference numerals refer to like features in FIGS. 3, 3A, 3B and at a subsequent fabrication stage of the processing method, portions of the spacer layer 30 over sections of the mandrel lines 24, 25 and over the non-mandrel lines 40 are etched to expose upper surfaces of upper mandrel line layers 28 and portions of lower hardmask 16, and to leave spacers 32 arranged on the sidewalls of mandrel lines 24, 25. The portions of the lower hardmask 16 exposed by the etch back process correspond to the non-mandrel lines 40. The non-mandrel etch mask 45 protects underlying portions of the spacer layer 30 during the etching process to form non-mandrel cut blocks 34 that are arranged over portions of the non-mandrel lines 40. The non-mandrel etch mask 45 may, in one example, also protect underlying portions of the spacer layer 30 that overlie portions of one or more of the mandrel lines 24, 25. The etching process may be, for example, a selective reactive ion etching (RIE) process that removes the material of the spacer layer 30 selective to the material of the non-mandrel etch mask 45, the material of lower hardmask 16, and the material of the upper mandrel line layers 28. Following the formation of the spacers 32 and the non-mandrel cut blocks 34, the non-mandrel etch mask 45 is removed. The non-mandrel etch mask 45 may be removed, for example, by ashing.

Figure 5:
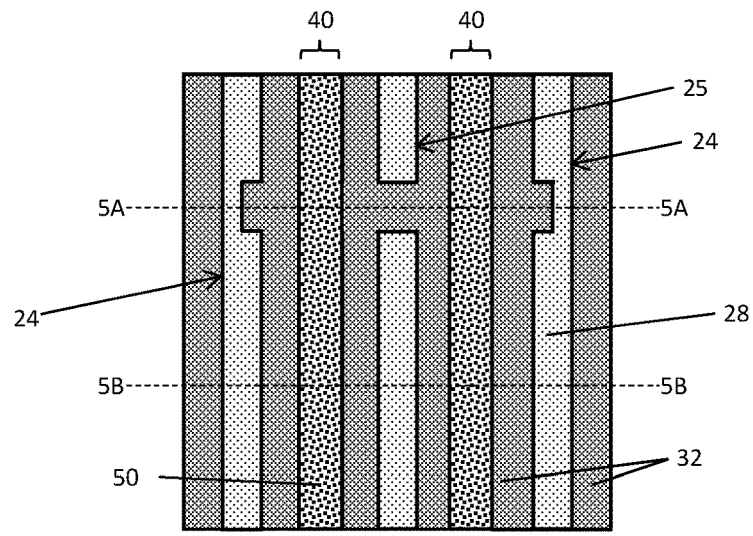
Figure 5A:
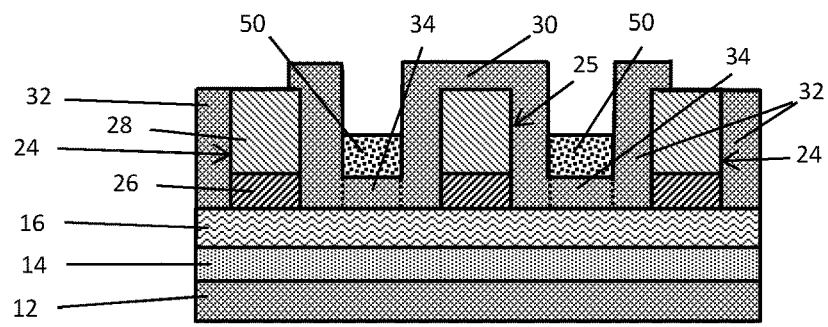
Figure 5B:
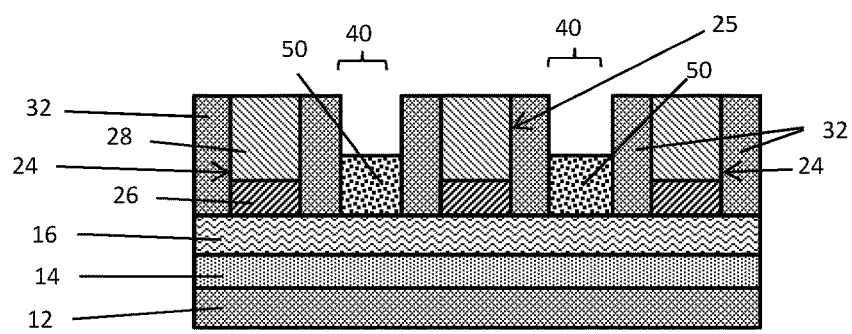

With reference to FIGS. 5, 5A, 5B in which like reference numerals refer to like features in FIGS. 4, 4A, 4B and at a subsequent fabrication stage of the processing method, a gapfill material 50 is deposited over the exposed portions of the lower hardmask 16 and the non-mandrel cut blocks 34. In one example, the gapfill material 50 may be deposited and subsequently etched back so that the gapfill material 50 only covers the exposed portions of the lower hardmask 16 and non-mandrel cut blocks 34, and is absent over the mandrel lines 24, 25. In one example, the gapfill material 50 may be a polymer material.

Figure 6:
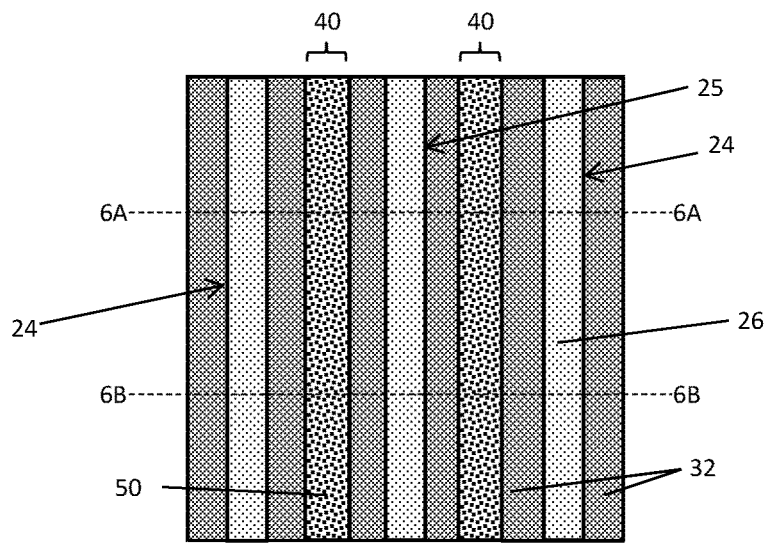
Figure 6A:
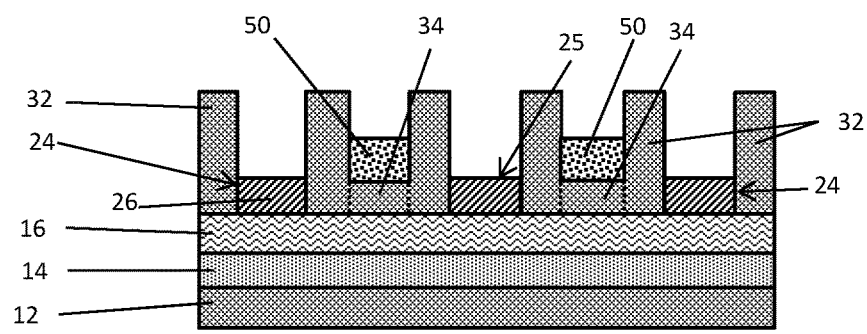
Figure 6B:
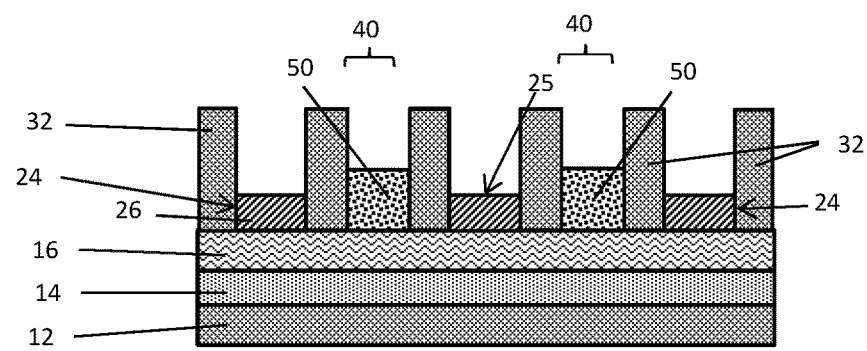

With reference to FIGS. 6, 6A, 6B in which like reference numerals refer to like features in FIGS. 5, 5A, 5B and at a subsequent fabrication stage of the processing method, the spacer layer 30 is etched further to remove previously unetched portions of the spacer layer 30 from over the mandrel lines 24, 25. The upper mandrel line layers 28 are then removed from the mandrel lines 24, 25. The lower mandrel line layers 26 remain after the upper mandrel line layer 28 have been removed. The gapfill material 50 protects the non-mandrel cut blocks 34 from the etch back of the spacer layer 30. The upper mandrel line layers 28 may be removed by a mandrel pulling process, such as a selective reactive ion etch (RIE) process, that removes the material of the upper mandrel line layers 28 selective to the material of the gapfill material 50, the material of the spacers 32, and the material of the lower mandrel line layers 26.

Figure 7:
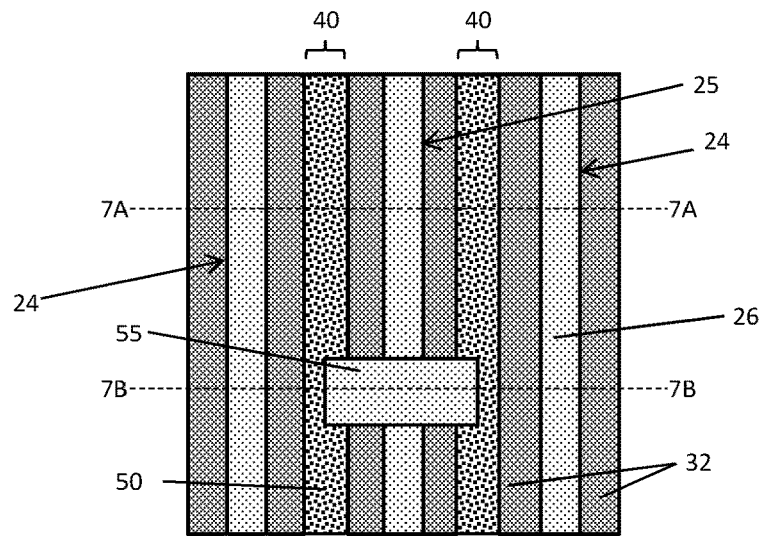
Figure 7A:
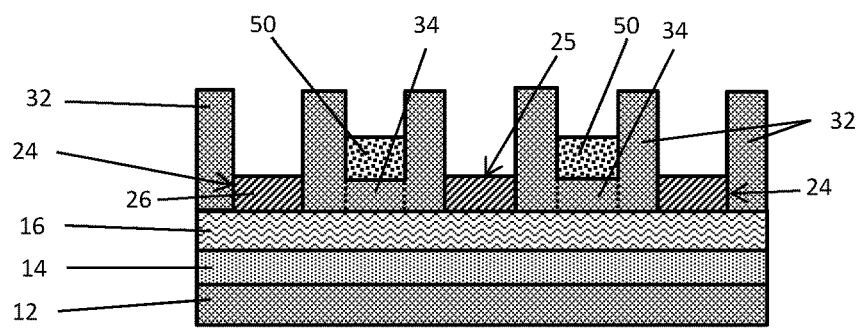
Figure 7B:
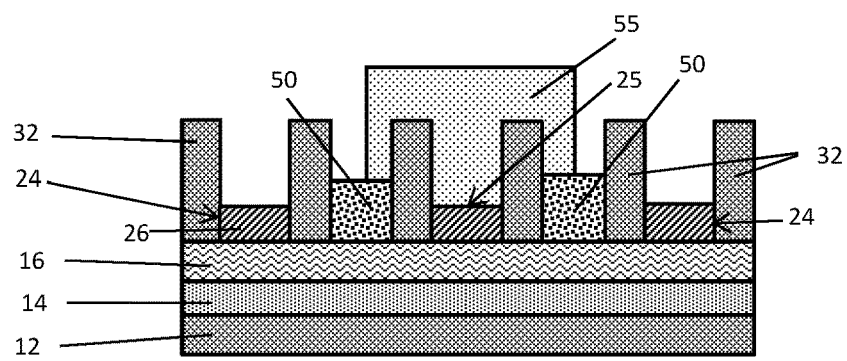

With reference to FIGS. 7, 7A, 7B in which like reference numerals refer to like features in FIGS. 6, 6A, 6B and at a subsequent fabrication stage of the processing method, a mandrel etch mask 55 is formed over a section of the lower mandrel line layer 26 of mandrel line 25. The section of mandrel line 25 covered by the mandrel etch mask 55 is arranged between adjacent sections of the lower mandrel line layer 26 of mandrel line 25 that remain exposed after the mandrel etch mask 55 is formed. The mandrel etch mask 55 may be formed, in one example, by depositing an etch mask material over the mandrel lines 24, 25, then forming a patterned lithography stack (not shown) over the etch mask material that exposes portions of the etch mask material to be removed and covers other portions of the etch mask material corresponding to the mandrel etch mask 55. Because the mandrel etch mask 55 is formed after spacer layer 30 has been deposited, the mandrel etch mask 55 may have a dimension along the length of the mandrel line 25 that is greater than twice the thickness of the spacers 32. The resulting cut in the corresponding metallization line may thus also have a dimension greater than twice the thickness of the spacers 32. The etch mask material may be composed of a material resistant to subsequent etching processes described below, such as a polymer, an organic planarization material, or another dielectric material. In one example, the etch mask material of the mandrel etch mask 55 may be composed of the same material, such as a polymer material, as gapfill material 50. The exposed portions of the etch mask material are removed by a selective etching process that is selective to the material of the spacers 32, the material of lower hardmask 16, and the material of lower mandrel line layers 26, leaving the mandrel etch mask 55 intact over a section of mandrel line 25.

Figure 8:
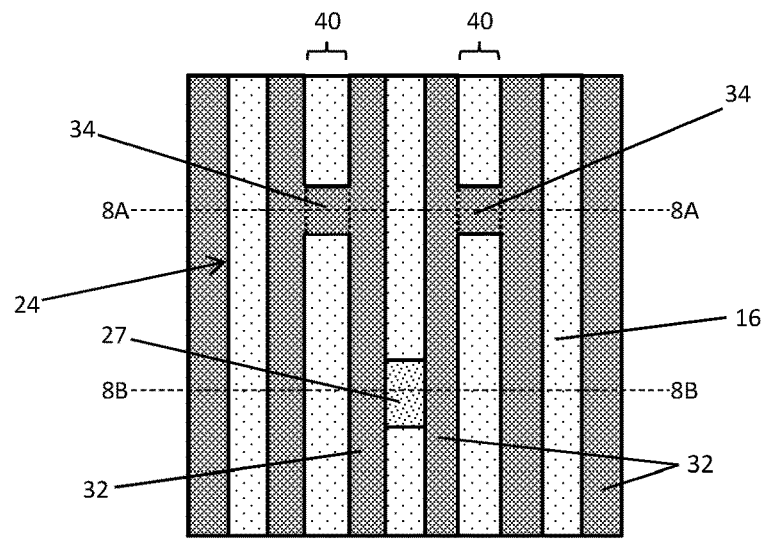
Figure 8A:
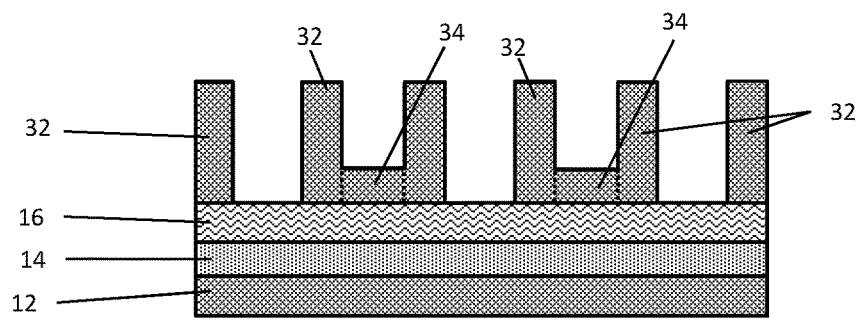
Figure 8B:
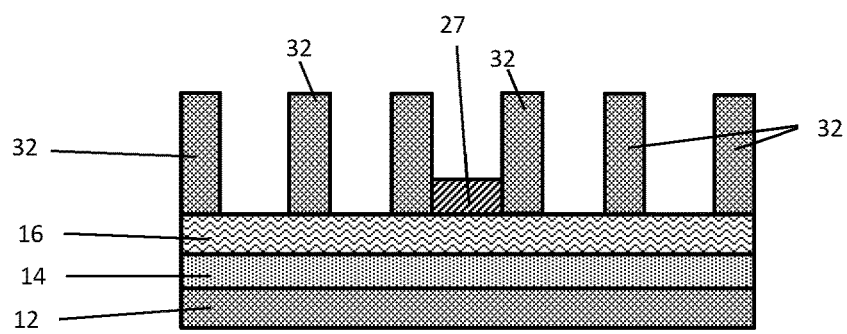

With reference to FIGS. 8, 8A, 8B in which like reference numerals refer to like features in FIGS. 7, 7A, 7B and at a subsequent fabrication stage of the processing method, the exposed sections of the mandrel line 25, along with the lower mandrel line layers 26 of mandrel lines 24, are removed to expose portions of the lower hardmask 16. The mandrel etch mask 55 protects underlying portion of the mandrel line 25 during the removal to form a mandrel cut block 27 over the lower hardmask 16. Following removal of lower mandrel line layers 26 and exposed sections of mandrel line 25, the mandrel etch mask 55 and gapfill material 50 are etched and removed to expose additional portions of lower hardmask 16. In embodiments in which the mandrel etch mask 55 and gapfill material 50 are composed of the same material, such as a polymer material, the mandrel etch mask 55 and gapfill material 50 may be concurrently removed by an ashing process.

Figure 9:
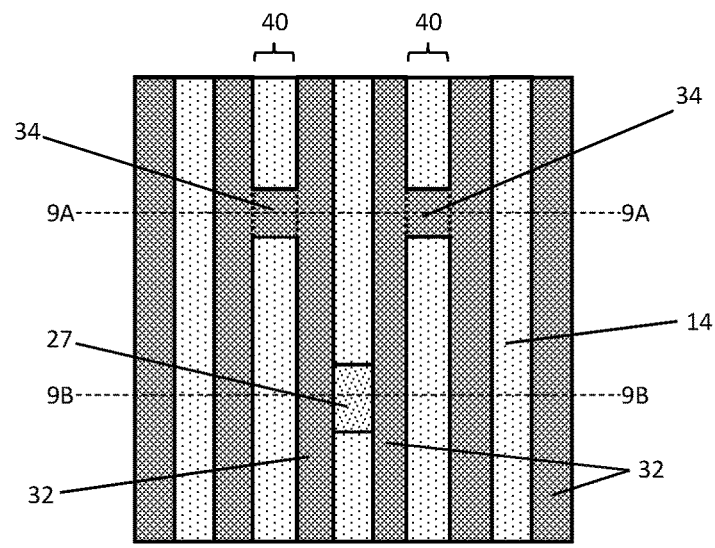
Figure 9A:
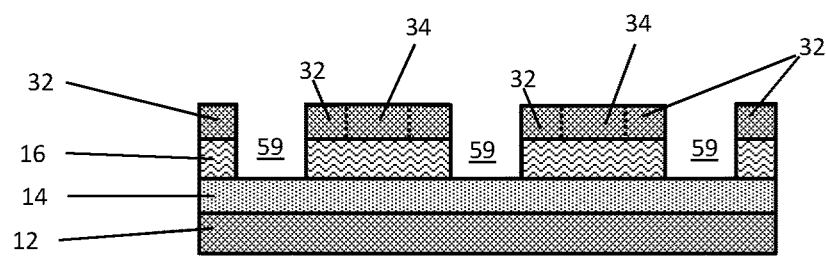
Figure 9B:
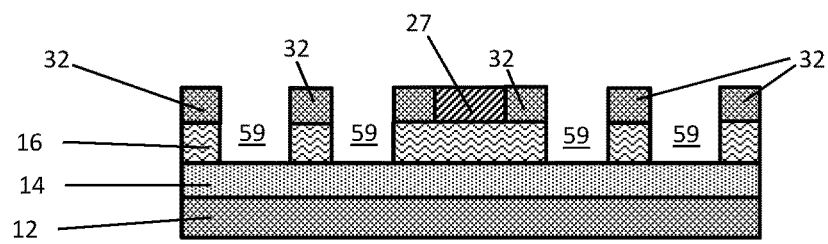

With reference to FIGS. 9, 9A, 9B in which like reference numerals refer to like features in FIGS. 8, 8A, 8B and at a subsequent fabrication stage of the processing method, the exposed portions of the lower hardmask 16 are removed by an etching process to form trenches 59 that expose underlying portions of the interlayer dielectric layer 14. The etching process may be, for example, a reactive ion etching (RIE) process. The etching process may also etch back the spacers 32 to provide a reduced spacer height, as shown in FIGS. 9A and 9B. The exposed portions and the masked portions of the lower hardmask 16 correspond to the pattern of pulled mandrel lines 24, 25, mandrel cut block 27, non-mandrel lines 40, and non-mandrel cut blocks 34. Portions of the lower hardmask 16 are masked by the mandrel cut block 27 and non-mandrel cut blocks 34 and, therefore, are protected from the etching process.

Figure 10:
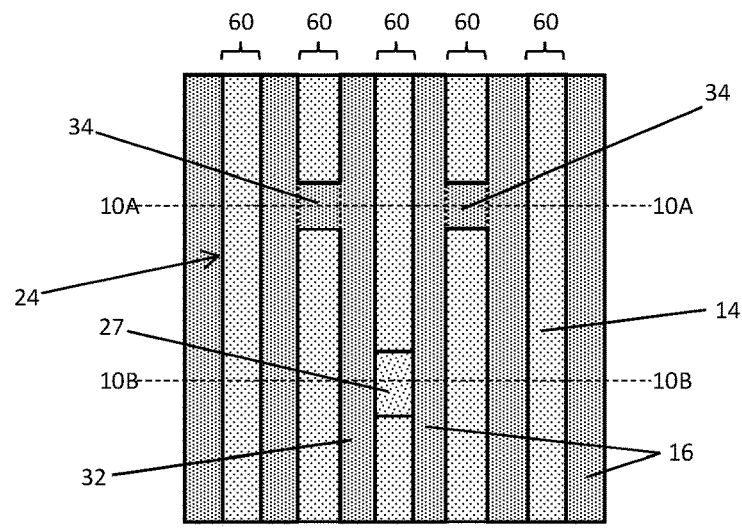
Figure 10A:
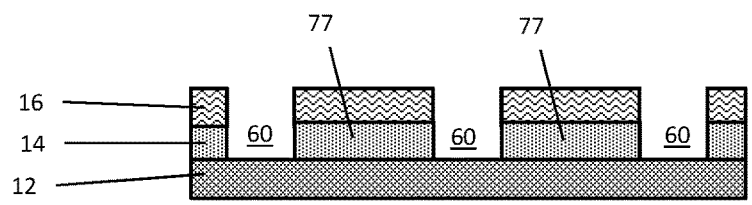
Figure 10B:
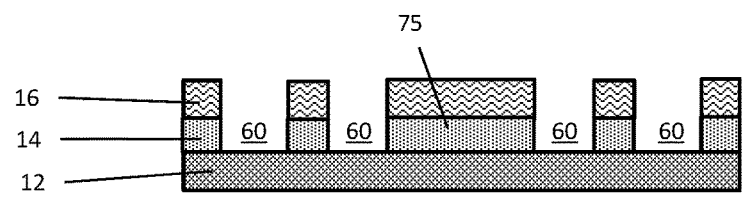

With reference to FIGS. 10, 10A, 10B in which like reference numerals refer to like features in FIGS. 9, 9A, 9B and at a subsequent fabrication stage of the processing method, the exposed portions of the interlayer dielectric layer 14 are removed by an etching process to form trenches 60 in the interlayer dielectric layer 14. The etching process may be, for example, a reactive ion etch (ME) process. The pattern of exposed portions and the masked portions of the interlayer dielectric layer 14 also corresponds to the pattern of pulled mandrel lines 24, 25, mandrel cut block 27, non-mandrel lines 40, and non-mandrel cut blocks 34 that is transferred by the etching process to the interlayer dielectric layer 14. A mandrel cut 75, which is filled with the material of the interlayer dielectric layer 14 and is produced by the mandrel cut block 27, is arranged in a row between the ends of an aligned pair of the trenches 60 and is transferred from the masked portion of the lower hardmask 16 when the interlayer dielectric layer 14 is patterned. Non-mandrel cuts 77, which are filled with the material of the interlayer dielectric layer 14 and are produced by the non-mandrel cut blocks 34, are also arranged in a row between the ends of an aligned pair of the trenches 60 and are transferred from respective masked portions of the lower hardmask 16 when the interlayer dielectric layer 14 is patterned.

Figure 11:
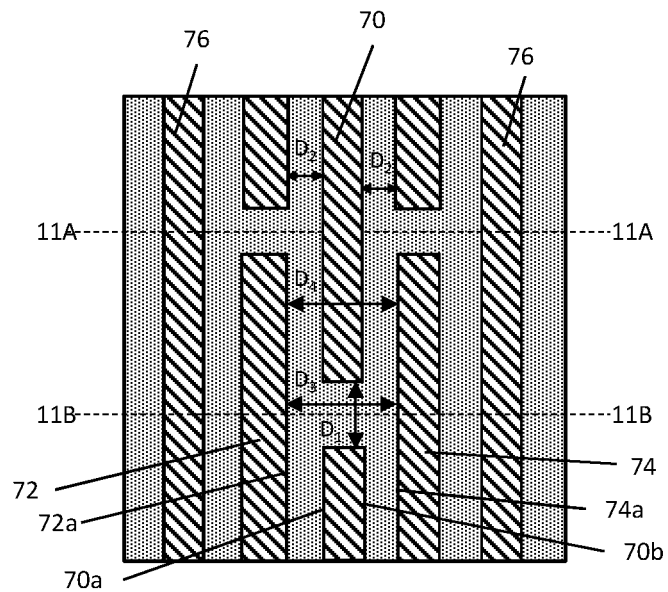
Figure 11A:
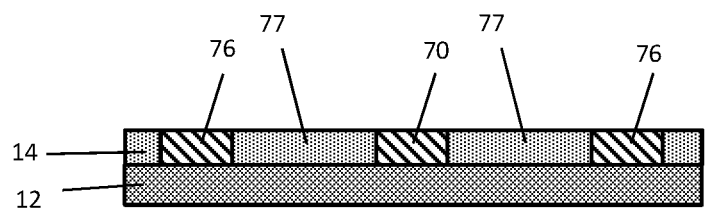
Figure 11B:
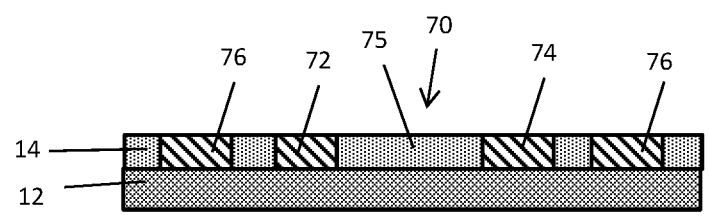

With reference to FIGS. 11, 11A, 11B in which like reference numerals refer to like features in FIGS. 10, 10A, 10B and at a subsequent fabrication stage of the processing method, a metal, such as copper or cobalt, is deposited in the trenches 60 to form metallization lines 70, 72, 74, 76. In an embodiment, the metallization lines 70, 72, 74, 76 may have a width of less than or equal to 20 nm. The mandrel cut 75, which is filled with the material of the interlayer dielectric layer 14, is arranged between linearly-aligned sections of the metallization line 70. The mandrel cut 75 separating the sections of metallization line 70 spans a tip-to-tip distance $D_1$ between the tips or ends of the sections of metallization line 70. The metallization line 72 has an outer sidewall 72a that is adjacent to and parallel to an outer sidewall 70a of metallization line 70, where the sidewall 70a and sidewall 72a are separated by a distance $D_2$. Similarly, the metallization line 74 has an outer sidewall 74a adjacent to and parallel to another outer sidewall 70b of metallization line 70, where the sidewall 70b and sidewall 74a are separated by distance $D_2$. The distance $D_1$ between the ends of the sections of metallization line 70 is variable and may be greater than twice the distance $D_2$, and may be selected when the mandrel cut block 27 is formed through a selection of its dimensions. Further, a distance $D_3$ between the outer sidewall 72a of metallization line 72 and the outer sidewall 74a of metallization line 74 that traverses the mandrel cut 75 may be equal to a distance $D_4$ between the outer sidewall 72a and the outer sidewall 74a that traverses a section of the metallization line 70.

Figure 12:
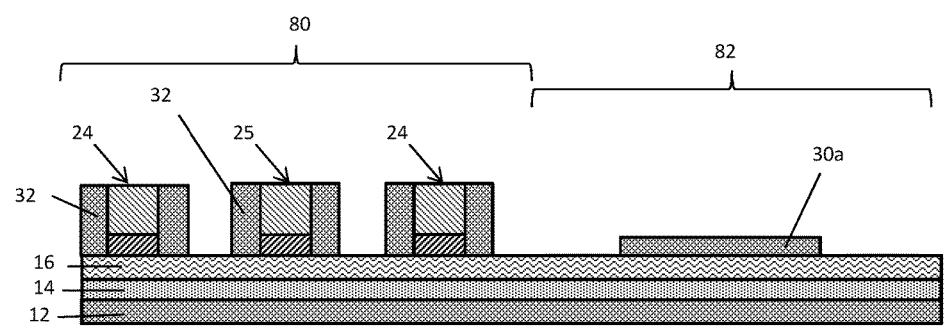
FIGS. 12 and 13 are cross-sectional views of the structures in FIGS. 4, 4A, 4B and FIGS. 5, 5A, 5B, respectively, depicting additional buffer regions (also known as "white regions" or "ANA regions") that may be included in the structure.

With reference to FIG. 12 in which like reference numerals refer to like features in FIGS. 4, 4A, 4B and in accordance with embodiments of the invention, the mandrel lines 24, 25 may be formed in a device region 80, and a portion 30a of the spacer layer 30 may be formed over a buffer region 82. The buffer region 82 may be included in an integrated circuit structure to isolate device regions 80 from one another and to ensure that device regions 80 remain thermally and electromagnetically isolated from one another. The portion 30a of spacer layer 30 in the buffer region 82 has a defined thickness equal to the defined thickness of spacers 32, as described above.

Figure 13:
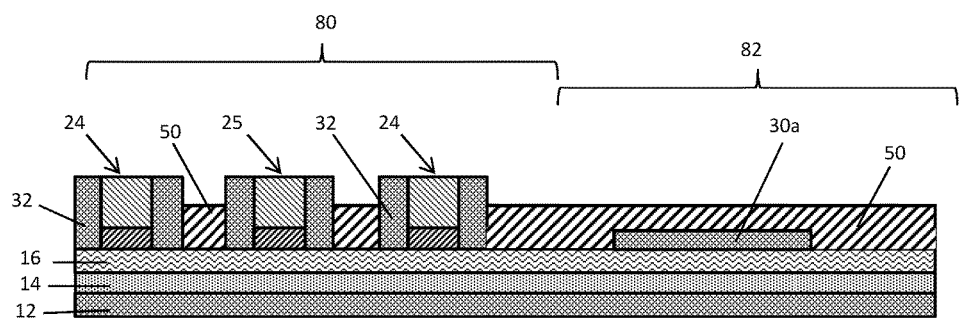

With reference to FIG. 13 in which like reference numerals refer to like features in FIG. 12 and at a subsequent fabrication stage of the processing method, the gapfill material 50 (FIGS. 5, 5A, 5B), which is deposited over the device region 80, is also deposited over the buffer region 82 so that the gapfill material 50 covers the portion 30a of spacer layer 30 over the buffer region 82. As described above, the gapfill material 50 protects non-mandrel cut blocks 34 from etching processes that remove portions of the spacer layer 30 in the device region 80. The gapfill material 50 also protects the portion 30a of spacer layer 30 disposed over buffer region 82 during etching processes that etch spacer layer 30 in the device region 80, thereby preventing a reduction in the thickness of portion 30a of the spacer layer 30 in the buffer region 82 during these etching processes.

In many integrated circuits, buffer regions generally include multiple non-conducting layers, such as dielectric hardmasks, spacer layers, polymer layers, and so on to ensure electrical isolation between device regions. As described above, spacer layers may be composed of silicon oxide while upper hardmasks may be composed of silicon nitride. In conventional fabrication processes, the silicon nitride hardmask is not etched until after the mandrel lines have been pulled and after the gapfill material has been removed from over the non-mandrel lines. Such processes, however, expose the portion of the spacer layer disposed on the buffer region to the silicon nitride hardmask etching process. Because silicon oxide has a low etch selectivity relative to silicon nitride, as the silicon nitride hardmask is etched over the device region the spacer layer over the buffer region may be eroded, decreasing the isolation properties of the buffer region. In the self-aligned double-patterning processes described above, however, the spacer layer 30 is deposited after the mandrel layer 20 and upper hardmask 18 have been etched to form the mandrel lines 24 and 25, and the gapfill material 50 protects the portion 30a of the spacer layer 30 during etching of portions of the spacer layer 30 in the device region. The portion 30a of the spacer layer 30 in the buffer region 82 is thus not exposed to the silicon nitride hardmask etching process, and thus may not be eroded during fabrication.

The methods of self-aligned double-patterning, as described above, are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    forming an upper layer and a lower layer of a mandrel line over a first hardmask;
    forming a non-mandrel cut block over a portion of a non-mandrel line;
    after forming the non-mandrel cut block, removing the upper layer of the mandrel line;
    forming a first etch mask over a first section of the lower layer of the mandrel line that is arranged laterally between adjacent second sections of the lower layer and that defines a mandrel cut block over a first portion of the first hardmask;
    after forming the first etch mask, removing the second sections of the lower layer of the mandrel line to expose respective second portions of the first hardmask; and
    removing the second portions of the first hardmask with a first etching process to form a trench in the first hardmask,
    wherein the first portion of the first hardmask is masked by the mandrel cut block during the first etching process.

2. The method of claim 1 wherein forming the mandrel line comprises:
    forming a layer stack including a second hardmask over the first hardmask and a mandrel layer over the second hardmask;
    etching the mandrel layer to form the upper layer of the mandrel line; and
    etching the second hardmask to form the lower layer of the mandrel line.

3. The method of claim 2 wherein the first hardmask is comprised of a first material, the second hardmask is comprised of a second material that can be removed selective to the first material, and the mandrel layer is comprised of a third material that can be removed selective to the second material and the first material.

4. The method of claim 3 wherein the first material is titanium nitride, the second material is silicon nitride, and the third material is amorphous silicon.

5. The method of claim 1 wherein forming the first etch mask comprises:
forming an etch mask material layer over the first section and the second sections of the lower layer of the mandrel line;
masking a first portion of the etch mask material layer; and
removing a second portion of the etch mask material layer with a second etching process,
wherein the first portion of the etch mask material layer forms the first etch mask and overlaps with the first section of the lower layer of the mandrel line.

6. The method of claim 5 wherein the etch mask material layer is comprised of a polymer material.

7. The method of claim 1 wherein the mandrel line includes a plurality of sidewalls, and further comprising:
depositing a conformal layer over the mandrel line and the non-mandrel line; and
removing a first portion of the conformal layer from over the upper layer of the mandrel line and the non-mandrel line with a second etching process to form respective spacers on the sidewalls of the mandrel line.

8. The method of claim 7 wherein the spacers have a defined thickness, and the first etch mask has a dimension along a length of the mandrel line that is greater than twice the defined thickness of the spacers.

9. The method of claim 8 wherein the defined thickness of the spacers is less than or equal to 20 nm.

10. The method of claim 7 wherein forming the non-mandrel cut block comprises:
before removing the first portion of the conformal layer, forming a second etch mask over a second portion of the conformal layer overlying the non-mandrel line,
wherein the second etch mask protects the second portion of the conformal layer during the second etching process, and the second portion of the conformal layer forms the non-mandrel cut block.

11. The method of claim 10 further comprising:
removing the second etch mask to expose the non-mandrel cut block and a third portion of the conformal layer;
before removing the upper layer of the mandrel line, forming a gapfill material over the non-mandrel line and the non-mandrel cut block; and,
removing, by a third etching process, the third portion of the conformal layer,
wherein the gapfill material protects the non-mandrel cut block from the third etching process.

12. The method of claim 11 wherein the gapfill material is composed of a polymer material.

13. The method of claim 12 wherein the first etch mask is composed of the polymer material, and the first etch mask and the gapfill material are concurrently removed before removing the second portions of the first hardmask.

14. The method of claim 11 wherein a fourth portion of the conformal layer is deposited over a buffer region, and the gapfill material is deposited over the fourth portion of the conformal layer disposed over the buffer region.

15. The method of claim 14 wherein the gapfill material protects the fourth portion of the conformal layer disposed over the buffer region during the second etching process and the third etching process.

16. A structure comprising:
a first metallization line, the first metallization line having a first outer sidewall, a second outer sidewall, a first section, a second section, and a cut in the first metallization line disposed between the first section and the second section; and
a second metallization line adjacent to the first metallization line, the second metallization line having a third outer sidewall adjacent to and parallel to the first outer sidewall,
wherein the cut spans a first distance between a first end of the first section and a second end of the second section, the first outer sidewall and the third outer sidewall are separated by a second distance, and the first distance is greater than two times the second distance.

17. The structure of claim 16 wherein the second distance separating the first outer sidewall and the third outer sidewall is less than or equal to 20 nm.

18. The structure of claim 16 wherein the first metallization line and the second metallization line are comprised of copper.

19. The structure of claim 16 further comprising:
a third metallization line adjacent to the first metallization line, the third metallization line having a fourth outer sidewall adjacent to the second outer sidewall,
wherein a third distance between the third outer sidewall and the fourth outer sidewall traversing the cut in the first metallization line is equal to a fourth distance between the third outer sidewall and the fourth outer sidewall traversing the first section of the first metallization line.

20. The structure of claim 19 wherein the first metallization line, the second metallization line, and the third metallization line each have a width of less than or equal to 20 nm.

* * * * *